United States Patent [19]
Pierson

[11] Patent Number: 5,394,025
[45] Date of Patent: Feb. 28, 1995

[54] STABILIZATION OF MOS-FET TYPE VOLTAGE TO CURRENT CONVERTERS

[75] Inventor: Joseph V. Pierson, Tucson, Ariz.

[73] Assignee: Lambda Electronics, Inc., Tucson, Ariz.

[21] Appl. No.: 69,228

[22] Filed: May 28, 1993

[51] Int. Cl.[6] .................. H03K 3/01; H03K 5/153; G06G 7/12; G06G 7/00
[52] U.S. Cl. .................. 327/530; 324/771; 327/538; 327/103; 327/518; 327/108
[58] Field of Search ............. 307/296.1, 296.5, 296.6, 307/296.8, 491, 494, 497, 529, 359, 540, 542, 270, 358, 362; 324/771

[56] References Cited

U.S. PATENT DOCUMENTS

| | | | |
|---|---|---|---|
| 5,043,598 | 8/1991 | Maeda et al. | 307/296.6 |
| 5,274,273 | 12/1993 | Baginski et al. | 307/494 |
| 5,276,367 | 1/1994 | Shibatani et al. | 307/494 |
| 5,296,802 | 3/1994 | Beranger et al. | 324/117 R |
| 5,313,109 | 5/1994 | Smith | 307/282 |

Primary Examiner—Timothy P. Callahan
Assistant Examiner—Trong Phan
Attorney, Agent, or Firm—Morgan & Finnegan

[57] ABSTRACT

An electric power dissipation system operates as an active load for power supply testing. The system has a closed loop voltage to current converter with a first and second load terminal. A capacitance is connected across the first and second load terminals. A power supply having a first and second output terminal is coupled to the first and second load terminals via test conductors which have a first and second inductance respectively. A correction signal generator is provided to be responsive to the power supply. The correction signal generator provides an output signal as a function of the voltage generated across one of the inductances. A summing circuit responds to the output signal of the correction signal generator and also responds to a command signal. The output of the summing circuit controls the current flow of the current converter.

14 Claims, 3 Drawing Sheets

STABILIZATION OF MOS-FET TYPE VOLTAGE TO CURRENT CONVERTERS

FIELD OF THE INVENTION

The present invention relates to electronic power dissipation products or electronic loads, and more particularly to closed loop voltage to current converters frequently employed in said products.

BACKGROUND OF THE INVENTION

Power dissipation products have become prevalent in many testing applications. Generally a power dissipation product functions as an active load drawing a controlled current flow from a power supply in response to a command signal. Thus various significant characteristics of a power supply may be tested by utilizing a power dissipation product which functions as an active load.

In many power dissipation products the controlled current is derived as a function of a voltage command signal. The current generated is proportional to a voltage command signal and may be derived by utilizing a voltage to current converter in a closed loop circuit.

In order to provide an accurate testing system, it is usually preferable to have a power dissipation product free of any oscillations. Consequently the voltage to current converter and the associated circuitry should have less than 360 degrees of voltage phase shift over the entire range of frequencies in which the closed loop circuit has a voltage gain greater than unity.

A preferred implementation of the voltage to current converter uses one or more metal-oxide-semiconductor field-effect transistors, commonly known as MOSFETs. MOSFETs can operate over a wide range of voltages and currents. They also have good low voltage characteristics and very low DC drive power requirements.

FIG. 1 illustrates a typical prior art power dissipation device 10. The power dissipation device includes two load terminals 22 and 24 and operates as an active load. Typically a power supply 12 to be tested is coupled to terminals 22 and 24. The test conductors that connect the terminals of power supply 12 to terminals 22 and 24 exhibit an inductance illustrated as inductances 14 and 16.

The power dissipation device 10 also includes a voltage to current converter 11 which further includes: a MOSFET transistor 36, which receives an error signal from error amplifier 30; feedback resistors 26 and 28, and input terminal 38 which receives a voltage input command signal.

MOSFET transistor 36 operates as a variable current sink for power supply 12. The drain of transistor 36 is coupled to terminal 22. The source of MOSFET 36 is coupled to the current sensing resistor 26 and the feedback resistor 28. Error amplifier 30 is coupled to the gate of MOSFET 36 and receives a voltage input command signal at terminal 38.

Power dissipation device 10 receives a command signal $V_1$ at terminal 38 and causes a current $I_1$, the magnitude of which is proportional to $V_1$, to flow from power supply 12 through the test cable inductance 14, then through the drain of MOSFET 36 to the source of the MOSFET, and then through resistor 26 and the test cable inductance 16 back to a power supply 12. The circuit maintains a constant current $I_1$ by comparing the voltage across resistor 26, to the current command signal $V_1$ at terminal 38, and producing via error amplifier 30 an error signal which is provided to the gate of transistor 36. Error amplifier 30 drives transistor 36 further into or out of conduction as necessary in order to keep the voltage across resistor 26 equal to voltage $V_1$ at terminal 32. Thus a constant current $I_1$ may be maintained.

However, one disadvantage of MOSFET transistor 36 is the presence of variable parasitic capacitance 34 between the gate and the drain of the transistor. This variable parasitic capacitance may cause oscillation, especially at low voltages where the drain terminal of the MOSFET transistor 36 is operated at voltages near to the voltage at the gate terminal of the MOSFET transistor. The drain to gate capacitance 34 provides undesirable variable magnitude feedback within the converter. The magnitude of the feedback depends mainly on the relationship of drain and gate terminal voltages, and the output impedance of circuitry driving the gate terminal.

The disadvantage caused by the gate to drain variable parasitic capacitance 34, becomes even worse due to the inductances 14, 16 of the test conductors that connect the power supply 12 to the load terminals 22 and 24. The combination of these inductances and the parasitic capacitance increases the probability of oscillation as the value of inductance is increased. This is due in part to the increased voltage swing at the drain terminal of the MOSFET transistor 36 as current is changed.

Oscillation due to the previously mentioned gate-drain capacitance is typically in the order of 10 kHz to 500 kHz, depending on the specific circuit components. Therefore it is difficult to design a wide voltage range electronic load for power supplies. The undesired oscillation prevents a proper testing of the power supply over a desired wide voltage range.

One approach in solving the oscillation problem is the use of a capacitor 18 across the load terminals 22 and 24. The capacitor 18 which has an equivalent series resistance 20, stabilizes the voltage at the MOSFET drain terminals by reducing the voltage swing which is coupled via gate-drain capacitance 34 to the gate terminal. Ideally, capacitance 18 with a small equivalent series resistance 20 is preferred to minimize voltage variations across the drain terminal.

However, one unfortunate result of placing capacitor 18 with small equivalent series resistance 20 across the load terminals 22 and 24 is that the inductances 14 and 16 and capacitance 18 form a resonance LC circuit with a high Q factor. This becomes a serious problem in some types of load operation, for example, when the load is operating in the voltage mode. During operation in the voltage mode, the electronic load controls the terminal voltage of the power supply by continually varying the load current by means of the voltage to current converter which in turn is controlled by the output of the voltage error amplifier which is responsive in turn to the power supply voltage. Consequently, any load current variation generates a ringing in the effective LC resonant circuit which may turn into oscillation due to characteristics of the voltage mode closed loop circuit described above.

Despite the desire for a capacitance with low equivalent series resistance, capacitance 18 has been typically selected with a considerably high equivalent series resistance 20 to provide a damping effect on the ringing caused by the resonant circuit formed by capacitance 18 and inductances 14 and 16. Although the high equivalent resistance would considerably alleviate ringing, it would also cause a wide voltage swing at terminal 22 which is connected to the drain of transistor 36.

The ringing caused by capacitance 18 and inductances 14 and 16 may cause undesirable current overshoots when load current is changed rapidly, for example, during the measurement of the transient response of the power supply. A further disadvantage resulting from the resonance circuit 14, 18 and 16 is that the output of the power supply would experience additional ripple currents and hence actual noise measurements of the power supply could not be accurately attained.

Hence there is a need for a current dissipation circuit with stable voltage characteristic and minimum voltage swing and oscillation across its load terminals.

SUMMARY OF THE INVENTION

It is therefore an object of the present invention to stabilize voltage to current converters utilized as a power dissipation circuit.

Another object of the present invention is to stabilize MOSFET type voltage to current converters.

Still another object of the present invention is to reduce the oscillation generated as a result of connecting a power supply to an electronic load, which has a MOSFET type voltage to current converter, for wide range of currents and voltages.

Yet another object is to substantially solve stability problems arising due to parasitic capacitance from drain to gate of power MOSFET in an electronic load.

Additional objects advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

According to the present invention, the foregoing and other objects are attained by providing a power dissipation system having a closed loop voltage to current converter with a first and second load terminal. In accordance with one aspect of the invention the system includes a capacitance which is connected across the load terminals of the voltage to current converter. A power supply having a first and second output terminal is coupled to the load terminals of the voltage to current converter via test conductors. The test conductors have a first and second inductance respectively. A correction signal generator responsive to the power supply provides an output signal as a function of a voltage generated across one of the first or second inductances. A summing circuit responsive to the output signal of the correction signal generator and further responsive to a voltage command signal provides a signal to control the current flow of the voltage to current converter.

In accordance with yet another aspect of the invention the voltage to current converter includes a MOSFET transistor. The drain of the MOSFET transistor is coupled to one terminal of the voltage to current converter. A current sensing resistor is connected between the source of the MOSFET transistor and the other terminal of the voltage to current converter.

In accordance with another aspect of the invention the gate of the MOSFET transistor receives a load error signal generated by the difference between the output of the summing circuit and a voltage across the current sensing resistor.

Still other objects and advantages of the present invention will become readily apparent to those skilled in the art from the following detailed description wherein only the preferred embodiment of the invention has been shown. As will be realized, the invention is capable of other and different embodiments, and its several details are capable of modifications in various obvious respects, all without departing from the invention. Accordingly, the drawing and description are to be regarded as illustrative in nature, and not as restrictive.

DETAILED DESCRIPTION OF THE DRAWINGS

As mentioned before, FIG. 1 illustrates a circuit diagram of a prior art power dissipation device 10 utilizing a voltage to current converter 11.

Figure 2:
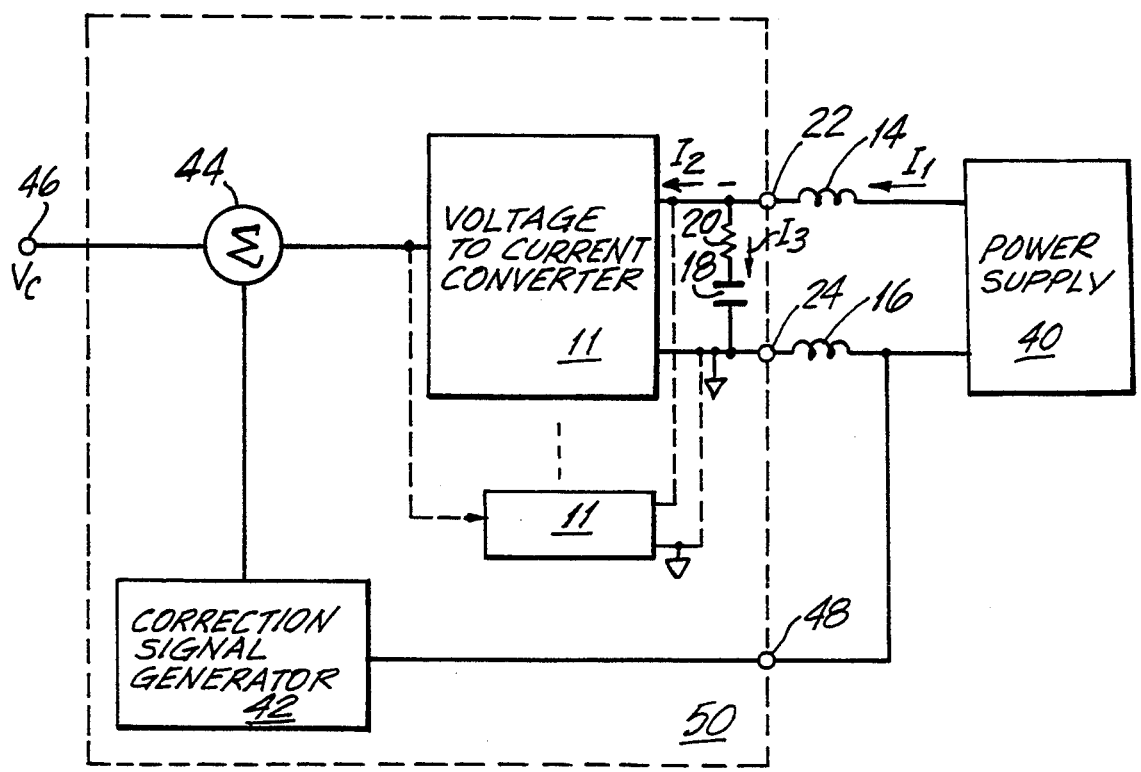
FIG. 2 illustrates the block diagram of a power dissipation device in accordance with this invention.

FIG. 2 illustrates the block diagram of the power dissipation device 50 in accordance with an embodiment of the present invention. The power dissipation device 50 includes two load terminals 22 and 24. Power supply 40 to be tested is coupled to terminals 22 and 24. The test conductors that connect the terminals of power supply 40 to terminals 22 and 24 exhibit an inductance illustrated as inductances 14 and 16.

Figure 1:
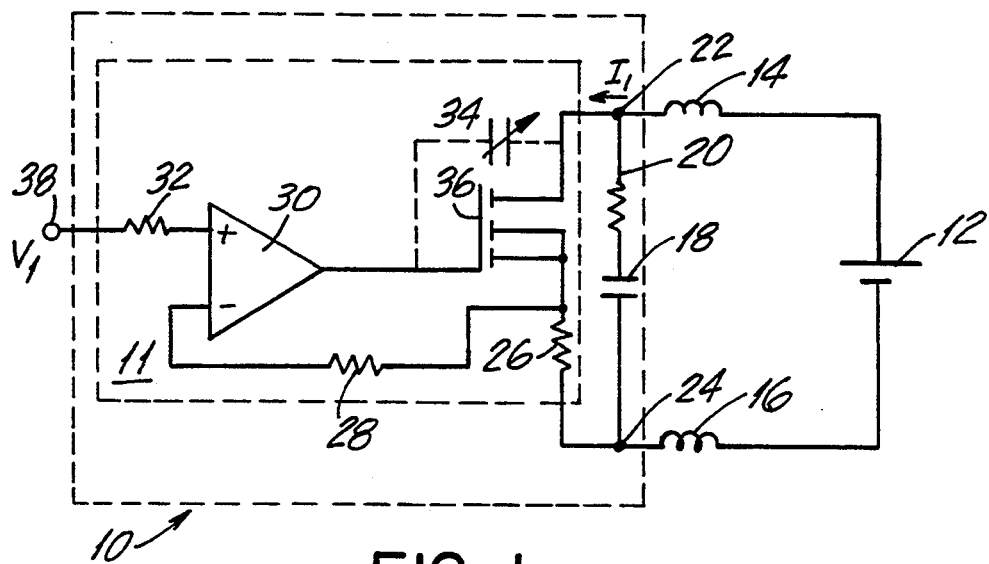
FIG. 1 illustrates the circuit diagram of a prior art power dissipation device.

The power dissipation device 50 according to one embodiment of the present invention includes a voltage to current converter 11, as described in connection with FIG. 1. Capacitor 18 is connected across the load terminals 22 and 24. Capacitor 18 has a small equivalent series resistance 20 to minimize voltage variations across the drain terminal of voltage to current converter 11.

Power dissipation device 50 also includes a correction signal terminal 48, which is coupled to the negative terminal of the power supply 40. It will be appreciated by those skilled in the art that terminal 48 can be alternatively coupled to the positive terminal of power supply 40. The voltage signal at terminal 48 is proportional to the voltage appearing across the inductance 16. It will also be appreciated that a plurality of voltage to current converters 11 may be connected in parallel, such that each converter 11 receives the same error signal from amplifier 44 and provides a current sink at terminals 22 and 24.

A correction signal generator 42 is responsive to the voltage signal at terminal 48 and generates a correction signal which is a function of the voltage at terminal 48. The output of the correction signal generator 40 can be any appropriate mathematical function applied to the voltage at terminal 48. For example, the correction signal generator may be a fixed or variable amplifier or attenuator; frequency dependent phase and or gain modifier; amplitude dependent phase and or gain modifier; complex function generator utilizing digital signal processing techniques. Furthermore for some applications the correction signal generator may be a mere bypass connection that directly couples the correction signal at terminal 48 to summing circuit 44. In that event a DC correction signal may be necessary at some stage of the system.

The output of the correction signal generator is coupled to a summing circuit 44 which is also responsive to a voltage command signal Vc applied to terminal 46. The output of the summing circuit 44 is coupled to the input of the voltage to current converter 11 to control the current flow $I_2$ into the converter 11.

According to one aspect of the present invention, oscillation generated by resonant circuit of inductances 14 and 16 and capacitance 18 is substantially avoided by utilizing the power dissipative device 50 of FIG. 2.

Figure 3:
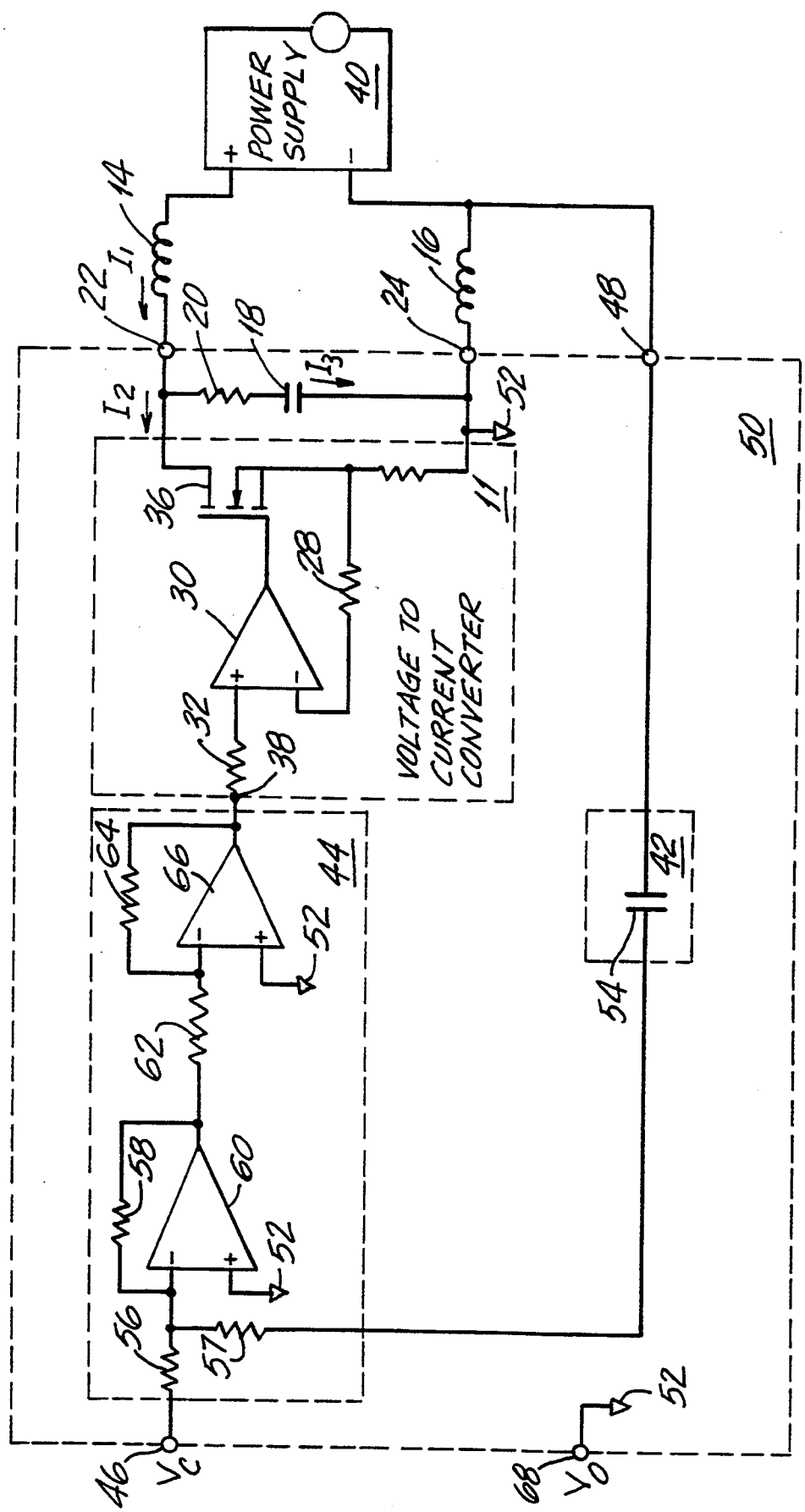
FIG. 3 illustrates a circuit diagram of a power dissipation device in accordance with one embodiments of this invention.

FIG. 3 illustrates the circuit diagram of another embodiment according to the present invention. As descried in connection with FIG. 2, power supply 40 to be tested is coupled to terminals 22 and 24, of power dissipation device 50. Inductances 14 and 16 represent the inherent inductances of load conductors that connect the terminals of power supply 40 to terminals 22 and 24.

The correction signal terminal 48 is coupled to the negative terminal of power supply 40. The voltage at terminal 48 is proportional to the voltage appearing across inductance 16. A DC voltage blocking capacitor 54 is coupled to correction signal terminal 48 at one end and to the inverting input terminal of summing amplifier 60 via resistor 57 at the other end. The inverting input summing amplifier 60 is also responsive to a voltage command signal Vc at terminal 46 via a resistor 56. A feedback resistor 58 couples the output of the summing amplifier 60 to its inverting input. The non-inverting input of amplifier 60 is coupled to a common reference terminal 52. The common reference terminal 52 is provided with a common reference voltage $V_0$ at terminal 68.

The output of the summing amplifier 60 is coupled to inverting input of amplifier 66 via a resistor 62. The non-inverting input of amplifier 66 is coupled to the common reference terminal 52. Feedback resistor 64 is connected between the output and the inverting input of amplifier 66. The output of amplifier 66 is connected to the input terminal 38 of the voltage to current converter 11.

The voltage to current converter 11 includes a MOSFET transistor 36, receiving an error signal from error amplifier 30. As mentioned before, the drain of transistor 36 is coupled to terminal 22, and its source is coupled to a current sensing resistor 26. Resistor 26 is also coupled to the common reference terminal 52. A feedback resistor 28 couples the voltage across the sensing resistor 26 to the inverting input of error amplifier 30. The voltage output of error amplifier 30 drives transistor 36 further into or out of conduction.

It will be appreciated by those skilled in the art that the correction signal generator in the embodiment illustrated in FIG. 3 incldes a DC blocking capacitor 54 and therefore the correction signal provided to summing amplifier 60 is directly proportional to the AC component of voltage signal across inductance 16.

The power dissipation device according to the present invention can be viewed as an active damping circuit. Therefore if the appropriate correction signal is applied to the summing circuit 60, the resonant circuit 14, 16 and 18 will have substantially less resonance. This operation may be explained by assuming that a current $I_1$ flows in the circuit initially for sometime so that in steady state condition, $I_1 = I_2$. The current flows due to the voltage command signal Vc at terminal 46. If a sudden or instantaneous change at the output voltage of power supply 40 occurs, for example in the positive direction, then a voltage will be developed across the inductances 14 and 16 which would cause a positive change in current $I_1$. Since the voltage to current converter 11 maintains a constant current flow, a change in $I_1$, is undesirable. Consequently, the correction signal at terminal 48 is driven negative which in turn reduces the amount of voltage applied at terminal 38. This in turn, will cause a sudden decrease in $I_2$. Since $I_1$, will try to remain at its previous level temporarily, the reduction in $I_2$ causes an increase in $I_3$ which charges capacitor 18. The charging of capacitor 18, creates a voltage across terminals 22 and 24 which counters the voltage that was developed across inductance 14 by the initial current change developed at the terminals of power supply 40. As the voltage across capacitor 18 approaches the voltage across the power supply terminals, the compensation signal also tends to reduce in amplitude until $I_2$ is once again equal to $I_1$. Since the above explained action will substantially prevent ringing or transients, the LC resonant circuit has no longer an effective high Q factor.

Figure 4:
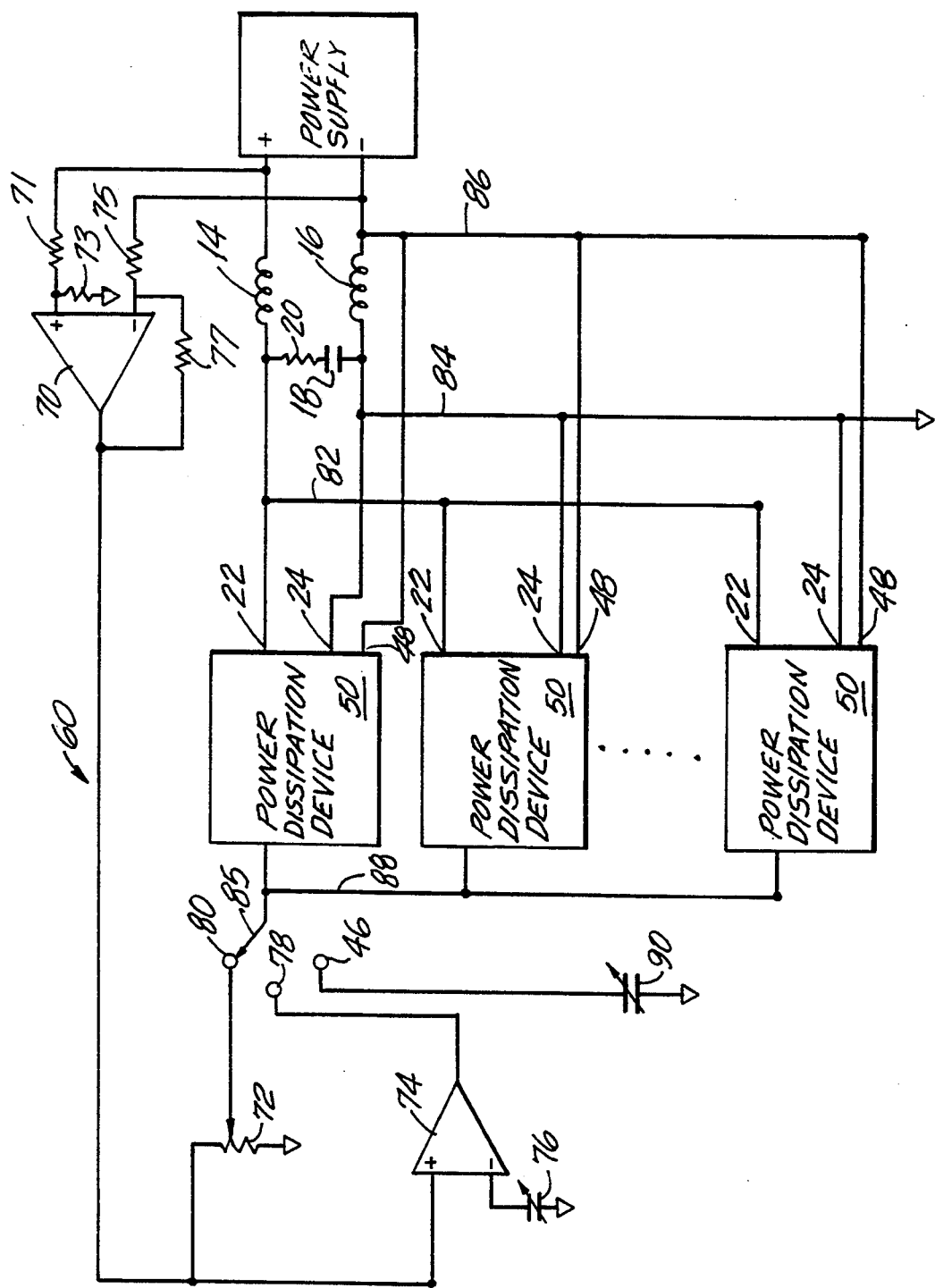
FIG. 4 illustrates a block diagram of a power dissipation device in accordance with another embodiment of this invention.

FIG. 4 illustrates another embodiment of the present invention, wherein a plurality of power dissipative devices 50 are connected in parallel forming a power dissipative system 100 which can operate in three different modes.

Accordingly, the power dissipative devices 50 are connected in parallel such that load terminals 22 of each device is connected to a common bus line 82. Similarly load terminal 24 of each device is connected to a common bus line 84. Correction signal terminal 48 of each device 50 is also connected to a common bus line 86. The input of each power dissipative device 50 is connected to a common bus line 88.

The positive output of power supply 40 is coupled to bus line 82 via inductance 14 and the negative output of power supply 40 is coupled to bus line 84 via inductance 16. The correction voltage across inductance 16 is coupled to correction signal terminal of each device 50. Differential amplifier 70 is coupled to the output terminal of power supply 40 via resistors 71, 73, 75 and 77 for sensing the voltage of the power supply. The output of differential amplifier 70 is coupled to a variable resistor 72 which in turn is connected to a terminal 80 of switch 85. The output of differential amplifier 70 is also coupled to the non-inverting input of amplifier 74, the inverting input of which is coupled to a variable voltage source 76. The output of amplifier 74 is connected to a terminal 78 of switch 85. A variable voltage source 90 is independently connected to the third terminal 46 of switch 85.

Switch 85 alternatively connects terminals 80, or 78 or 46 to bus line 88. Thus the power dissipative system 100 can operate as a constant resistive load when switch 85 connects to terminal 80. The electronic load 100 operates as a constant voltage load when switch 85 connects to terminal 78. Finally, the electronic load 100 operates as a constant current load when switch 85 connects to terminal 46.

Accordingly when the power dissipative system 100 functions as a constant resistive load, resistance 72 can be adjusted to a desired value. Any change in the output voltage of power supply 40 would cause a change in the command voltage provided by resistor 72 to bus 88 such that the ratio of voltage to current developed at terminals 22 and 24 will remain constant.

Similarly, when system 100 is operating as a constant voltage load, the voltage at the output of power supply 40 is compared to the desired voltage provided by voltage source 76. The output of amplifier 74 provides an error signal that drives the power dissipation devices 50, such that the voltage across terminals 22 and 24 remain constant.

The operation of system 100 as a constant current load, as described before with reference to FIG. 3, allows for a constant current to be drawn from power supply 40. This is accomplished by providing a desired common voltage to bus 88 via voltage source 90. The current drawn from power supply 40 would then be proportional to the voltage command signal generated by voltage source 90. It can be appreciated by those skilled in the art that the various load modes as described above may be implemented with one or more power dissipative device 50.

The power dissipative device according to the present invention provides a more stable electronic load for testing power supplies. The transient response of the system is improved and ringing is substantially eliminated by utilizing a correction signal generator.

The invention in its broader aspects therefore is not limited to the specific embodiments herein shown and described, but departures may be made therefrom within the scope of the accompanying claims without departing from the principles of the invention and without sacrificing its chief advantage.

I claim:

1. A power dissipation system for testing a power supply having first and second output terminals using test conductors having inductive properties, said power dissipation system comprising:
   (1) a closed loop voltage to current converter with first and second load terminals for connection via said test conductors to said tested power supply;
   (2) a circuit having a capacitance connected across said first and second load terminals;
   (3) a correction signal generator responsive to said power supply, said correction signal generator providing an output signal as a function of voltage generated across one of said first or second inductances; and
   (4) a summing circuit responsive to said output signal of said correction signal generator and further responsive to a command signal, the output of said summing circuit controlling the current flow of said voltage to current converter.

2. The invention as claimed in claim 1 wherein said voltage to current converter further comprise a MOSFET transistor.

3. The invention as claimed in claim 2, wherein the drain of said MOSFET transistor is coupled to said first load terminal and a current sensing resistor is connected between the source of said MOSFET transistor and said second load terminal.

4. The invention as claimed in claim 3, wherein the gate of said MOSFET transistor is responsive to a load error signal generated by the difference between said output of said summing circuit and voltage across said current sensing resistor.

5. The invention as claimed in claim 1 wherein said correction signal generator is a DC blocking capacitor coupled between said negative terminal of said power supply and inverting input of said summing circuit.

6. The invention as claimed in claim 5 wherein said command signal is generated by a constant voltage source coupled to the inverting input of said summing circuit.

7. The invention according to claim 6 wherein a plurality of said voltage to current converters are connected in parallel and being responsive to said voltage error signal and sinking current from said first and second load terminals.

8. The invention as claimed in claim 5 wherein said positive and negative terminals of said power supply are coupled to a differential amplifier and said command signal is proportional to the difference between the output of said differential amplifier and a constant voltage signal.

9. The invention as claimed in claim 5 wherein said positive and negative terminals of said power supply are coupled to a differential amplifier output of which is coupled to a variable resistance and said command signal is a voltage generated across said resistance.

10. A power dissipative system for testing a power supply having first and second output terminals using test conductors having inductive properties, said power dissipation system comprising:
    (1) a plurality of closed loop voltage to current converters each having first and second load terminals wherein said first load terminals are connected to each other and said second load terminals are connected to each other;
    (2) a circuit having a capacitance connected across said first and second load terminals;
    (3) a plurality of correction signal generators each corresponding to one of said voltage to current converters, responsive to said power supply, said correction signal generators each providing an output signal as a function of voltage generated across one of said first or second inductance; and
    (4) a plurality of summing circuits each responsive to a corresponding output signal of one of said correction signal generators and further responsive to a command signal, output of each one of said summing circuits controlling the current flow of corresponding current converter.

11. The invention as claimed in claim 10 further comprising a variable resistance for providing said command signal and a voltage sensing means responsive to the output of said power supply for providing a voltage to said variable resistance.

12. The invention as claimed in claim 10 further comprising an error amplifier for providing said command signal, and a voltage sensing means responsive to the output of said power supply for providing a sensing voltage to said error amplifier, said error amplifier providing an output voltage proportional to the difference between said sensing voltage and a reference voltage.

13. A method for providing a stable electronic load for a power supply having first and second output terminals using test conductors having inductive properties, said method comprising the steps of:
    (1) providing a closed loop voltage to current converter with first and second load terminals for connection via said test conductors to said tested power supply;
    (2) connecting a capacitance across said first and second load terminal;
    (3) providing a correction signal responsive to said power supply as a function of voltage generated across one of said first or second inductances; and (4) coupling said correction signal to a summing circuit responsive to a command signal, output of said summing circuit controlling the current flow of said current converter.

14. The invention as claimed in claim 13 wherein said step of providing a correction signal further comprise the step of coupling a DC blocking capacitor between said negative terminal of said power supply and inverting input of said summing circuit.

* * * * *